(12) United States Patent
Chen

(10) Patent No.: US 6,653,645 B1
(45) Date of Patent: Nov. 25, 2003

(54) DEFLECTION LENS DEVICE FOR ELECTRON BEAM LITHOGRAPHY

(76) Inventor: Hsing-Yao Chen, 222 Bridle Path Ct., Fox River Grove, IL (US) 60021

(*) Notice: Subject to any disclaimer, the term of this patent is extended or adjusted under 35 U.S.C. 154(b) by 0 days.

(21) Appl. No.: 09/570,899
(22) Filed: May 15, 2000
(51) Int. Cl.⁷ .................................................. G21G 5/00
(52) U.S. Cl. ...................................... 250/492.3; 315/17
(58) Field of Search ........................... 250/492.3, 492.2, 250/492.22, 494.1; 315/17

(56) References Cited

U.S. PATENT DOCUMENTS

| | | | |
|---|---|---|---|
| 3,900,760 A | * 8/1975 | Glenn et al. | 313/429 |
| 4,163,155 A | * 7/1979 | Alles et al. | 250/492.3 |
| 4,438,557 A | * 3/1984 | Parker et al. | 250/492.22 |
| 4,963,748 A | * 10/1990 | Szilagyi | 250/396 R |
| 5,036,195 A | * 7/1991 | Batey et al. | 250/281 |
| 5,414,267 A | * 5/1995 | Wakalopulos | 250/400 |
| 5,760,960 A | * 6/1998 | Lin et al. | 359/34 |
| 6,014,200 A | * 1/2000 | Sogard et al. | 250/492.3 |
| 6,122,599 A | * 9/2000 | Mehta | 702/100 |

* cited by examiner

Primary Examiner—John R. Lee
Assistant Examiner—Christopher M. Kalivoda
(74) Attorney, Agent, or Firm—Emrich & Dithmar

(57) ABSTRACT

An electron beam device includes an electron beam source, plural spaced plates having aligned apertures through which an electron beam is directed, an electrostatic focusing arrangement, and plural electrostatically charged deflection plates for deflecting the beam and displacing it over a target surface. The apertures in the spaced plates are of deceasing size in the direction of travel of the electron beam for intercepting the outer periphery of the beam and providing a beam of reduced cross section. The electron beam is simultaneously deflected by the deflection plates and focused by the electrostatic focusing arrangement. The electrostatic focusing arrangement includes first and second focusing elements through which the beam is directed which are disposed along the beamline and adjacent the upper and lower end portions, respectively, of the beam deflection plates. The electron beam device is of small size, permitting plural devices to be arranged in two- and three-dimensional compact matrix arrays for dense electron beam lithography arrangements such as for use in the simultaneous manufacture of large numbers of semiconductor devices to boost the throughput in integrated circuit manufacture inexpensively.

34 Claims, 4 Drawing Sheets

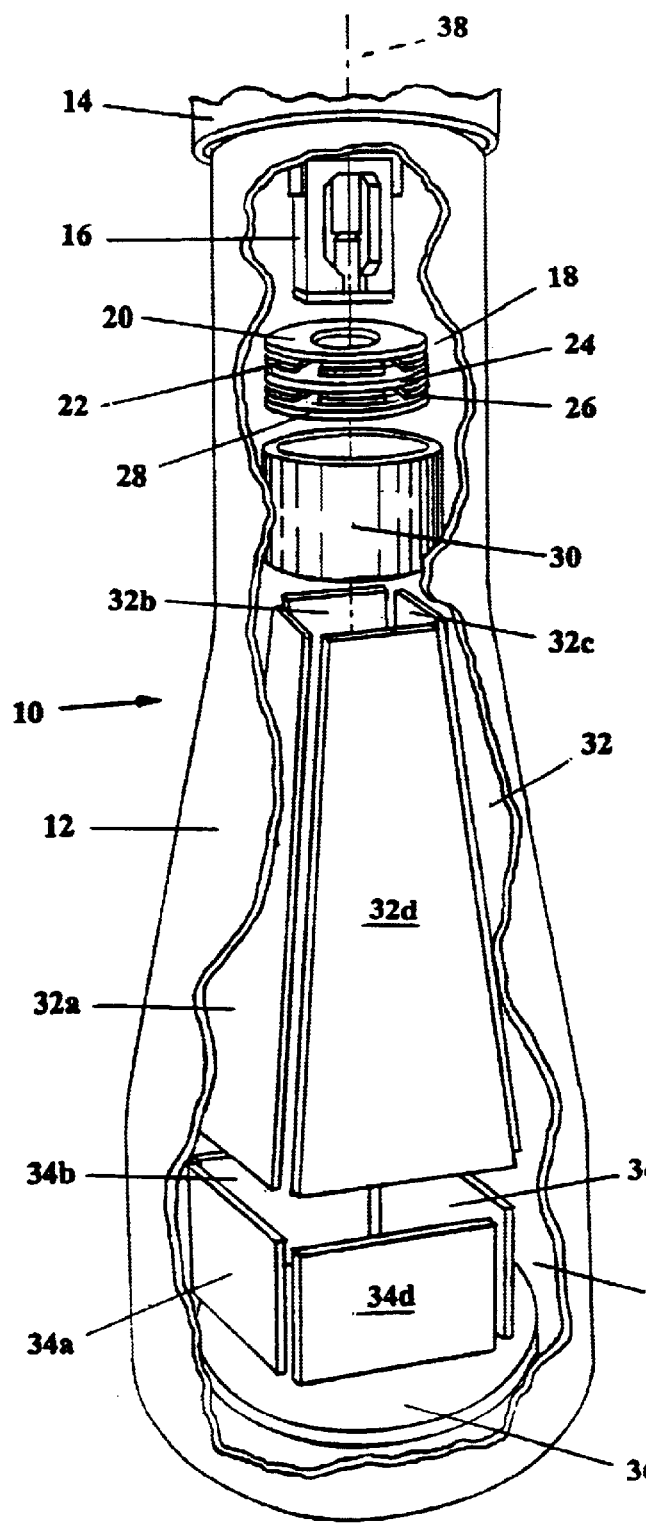
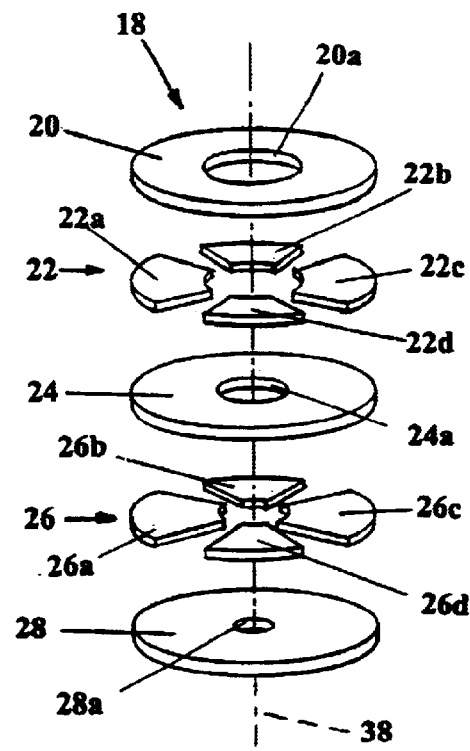
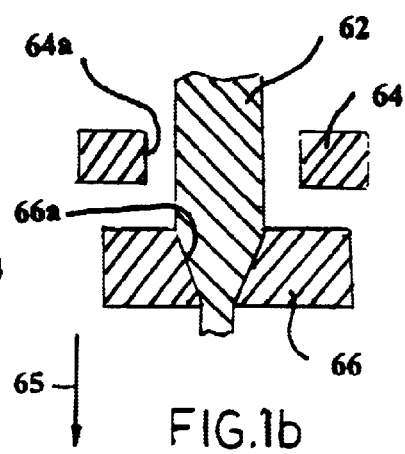
FIG. 1
FIG. 1a
FIG. 1b

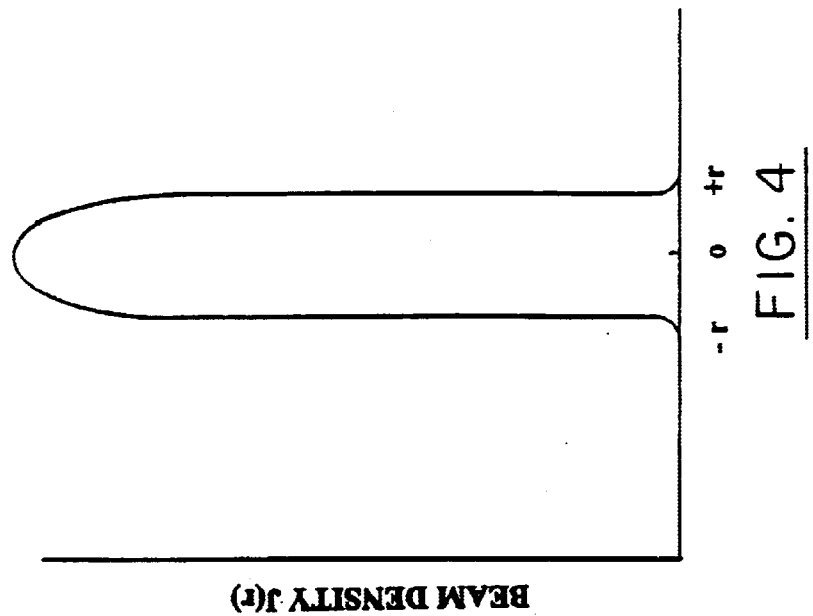
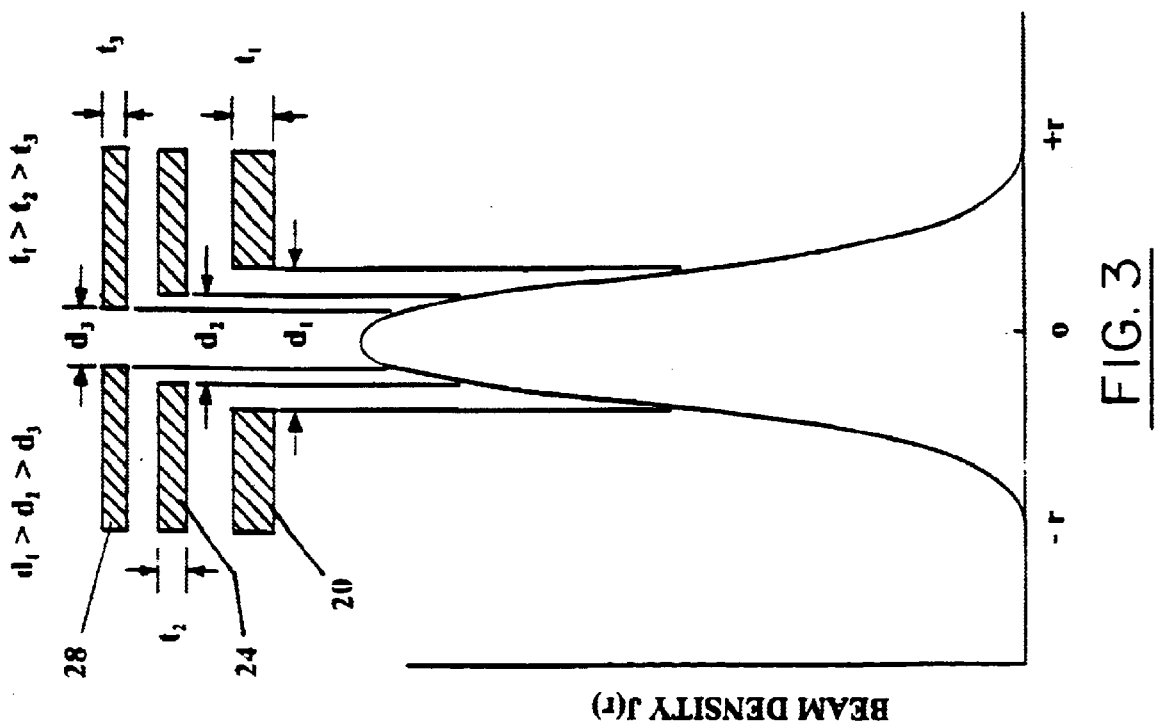

DEFLECTION LENS DEVICE FOR ELECTRON BEAM LITHOGRAPHY

FIELD OF THE INVENTION

This invention relates generally to the generation and use of high energy electron beams and is particularly directed to an electron device incorporating an electron beam deflection lens for use in electron beam lithography.

BACKGROUND OF THE INVENTION

In general, semiconductor devices are manufactured using photolithography techniques for reproducing the image of a reticle onto a photosensitive resist-covered semiconductor wafer. A light source in this photolithography approach typically directs ultraviolet (UV) light onto the photosensitive resist-covered semiconductor wafer. As the line width becomes more and more narrow such as in forming more compact electronic circuits, i.e., line widths of 0.35 $\mu$m and below, a UV light source of shorter wavelength is required. As the UV wavelength decreases, an optical glass lens becomes opaque to the UV light and a quartz optical lens is required. Even through quartz, transmission of UV light is limited resulting in corresponding limits on the intensity of the UV light directed onto the substrate. The use of quartz also increases the cost of this approach. In addition, with shorter wavelength UV light, the depth of focus also becomes proportionately more critical. Thus, the semiconductor wafer's surface flatness requirement becomes increasingly more difficult and costly to achieve.

Another approach has also been adopted in the fabrication of semiconductor devices. This latter approach employs an electron beam directed onto the semiconductor wafer for tracing out the desired integrated circuit pattern. This electron beam lithography approach also suffers from limitations which have restricted its adoption on a widespread basis in the fabrication of semiconductor devices. For example, the speed available in tracing the electron beam over the semiconductor wafer (substrate) is much slower than the speed achievable in a standard step-and-repeat optical device used in the above-described photolithography manufacturing approach. Also, current electron beam sources for use in semiconductor device lithography are too expensive and bulky to permit their adoption on a wide scale in the manufacture of semiconductor devices.

The present invention addresses the aforementioned limitations of the prior art by providing an electron beam device for use in electron beam lithography in the fabrication of semiconductor integrated circuits which does not require an expensive optical light source and lens mask combination, is capable of forming line widths of extremely small size on a semiconductor wafer, possesses a depth of focus at least ten times greater than that available in optical systems, employs a multi-stage digitized beam deflection system which provides precise control of electron beam position, and is compact in shape, small in size and of low cost.

OBJECTS AND SUMMARY OF THE INVENTION

Accordingly, it is an object of the present invention to provide apparatus for electron beam lithography such as used in the manufacture of semiconductor integrated circuit devices.

It is another object of the present invention to provide a small, compact electron beam device which can be used in two- and three-dimensional matrix arrays for producing dense circuit designs in simultaneously fabricating large numbers of semiconductor integrated circuit devices.

Yet another object of the present invention is to provide an electron beam device capable of directing an electron beam of very small cross section onto a substrate and precisely controlling the position of the beam on the substrate for fabricating a micro-miniature semiconductor integrated circuit device.

A further object of the present invention is to provide an electron beam source having a large depth of focus which is capable of accommodating substrates having reduced flatness characteristics in the manufacture of semiconductor integrated circuit devices by means of electron beam lithography.

This invention contemplates an electron beam device incorporating a beam deflection lens for the simultaneous deflection and focusing of the electron beam on a target surface such as a substrate used in the manufacture of semiconductor integrated circuit devices. The electron beam device further includes a beam source for directing an electron beam through plural aligned apertured plates arranged in a spaced manner along the direction of travel of the beam. Each of the plates includes a respective limiting aperture aligned along the beam axis, with the limiting apertures decreasing in diameter in proceeding along the direction of travel of beam. The apertured plates intercept peripheral portions of the electron beam in reducing beam cross section to provide a very narrow, precisely defined electron beam incident upon the substrate. Positioning electrodes may also be concentrically disposed about the beam axis and disposed between adjacent apertured plates for centering the beam. The beam limiting arrangement may also be in the form of a single apertured plate with a tapered aperture which is larger on the surface of the plate in facing relation to the source of energetic electrons. After transiting the beam limiting apertures in the aligned plates, the beam is then directed through a cylindrical shaped focusing electrode and then passes through plural electrostatic charged deflection plates disposed in a spaced manner about the electron beam. The position of incidence of the electron beam on the substrate is precisely controlled by the electrostatic charges applied to the deflection plates. The deflection plates are angled away from the beam axis in proceeding along the direction of travel of the beam to provide precise, highly sensitive control of electron beam positioning. After transiting the deflection plate stage, the electron beam is further focused by means of a second electrostatic lens which also may be in the form of plural, flat, charged plates disposed in a spaced manner about the beam. Alternatively, the second electrostatic lens may also be a single member cylindrical in shape. The electron beam is simultaneously focused and deflected by means of the unique deflection lens arrangement of the inventive electron beam device for providing a small, compact device which can be arranged in two- and three-dimensional matrix arrays for simultaneously fabricating large numbers of dense electronic circuits in plural semiconductor integrated circuit devices. The electron beam is of a very small cross section and may be displaced, i.e., deflected over the substrate, for high speed, high density semiconductor integrated circuit device fabrication.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 1 is a partially cutaway perspective view of an electron beam device having a deflection lens in accordance with the present invention which is particularly adapted for use in electron beam lithography;

FIG. 1a is an exploded perspective view of an electron beam centering and cross section limiting aperture arrangement employed in the electron beam device of the present invention;

FIG. 1b is a sectional view of another arrangement for limiting the cross section of the electron beam in the electron beam device of the present invention;

FIG. 3 is a graphic representation of the profile of a typical electron beam, with the effects of plural electron beam limiting apertures on the beam cross section also shown in the figure in accordance with one aspect of the present invention.

FIG. 4 is a graphic representation of the profile of an electron beam after transiting the first beam limiting aperture in the electron beam device of the present invention;

DETAILED DESCRIPTION OF THE PREFERRED EMBODIMENTS

Referring to FIG. 1, there is shown a partially cutaway perspective view of an electron beam device 10 with a deflection lens for use in electron beam lithography in accordance with the principles of the present invention. The electron beam device 10 includes a tapered envelope 12 having a circular cross-section. Disposed on an end of the envelope 12 is a mounting socket 14 (partially shown in the figure) for electrically connecting the electron beam device 10 to a source of electrical power as well as to a source of control signals for operation of the electron beam device.

Figure 2:
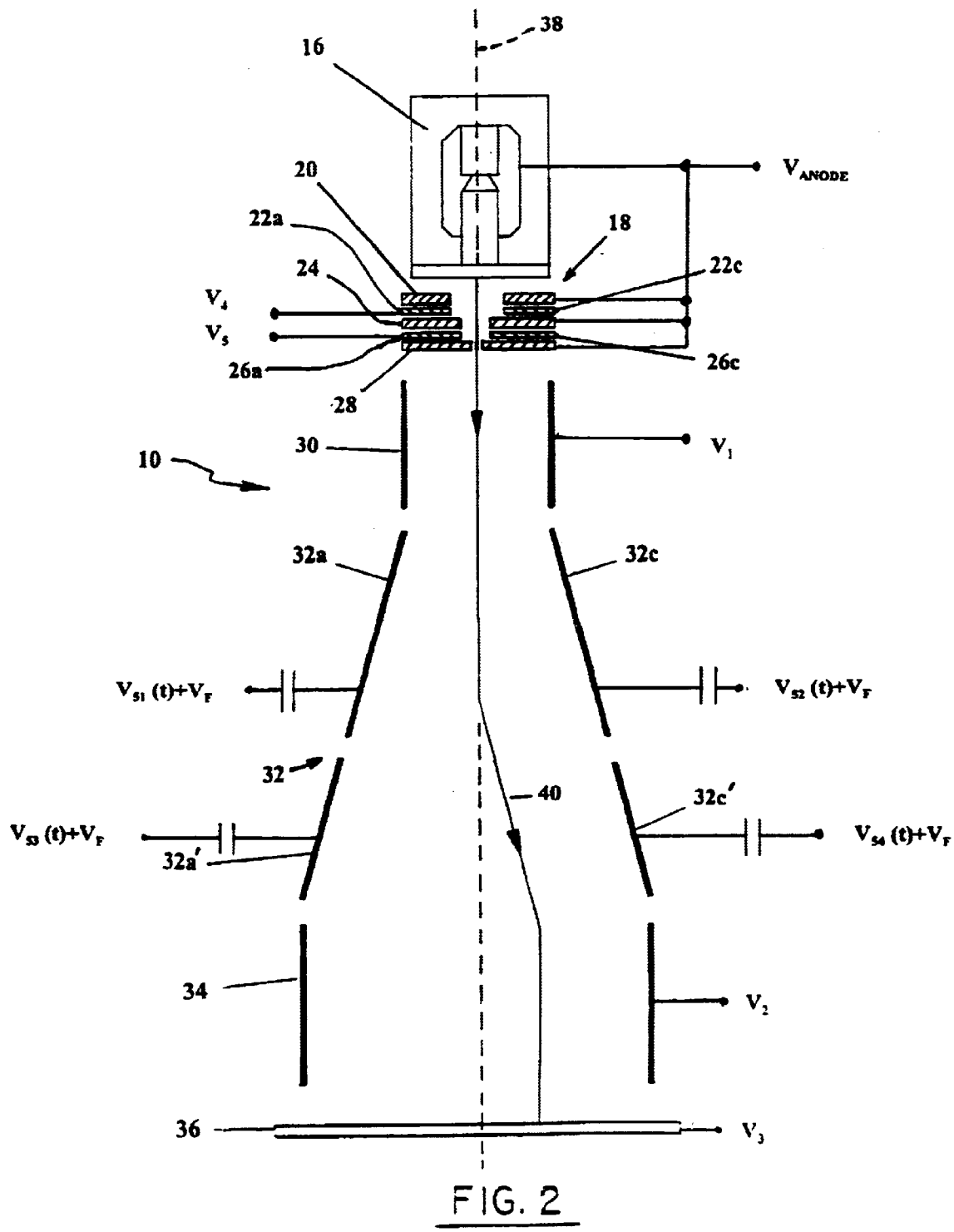
FIG. 2 is a longitudinal sectional view of the electron gun portion of the electron device shown in FIG. 1 further illustrating the electrical connections to the various components of the electron gun.

Electron beam device 10 includes an electron gun 16 which is attached to and electrically coupled to the mounting socket 14. Electron gun 16 generates energetic electrons and forms the electrons into a beam 40 as shown in the partial sectional view of the electron beam device of FIG. 2. For simplicity, the electron beam device's envelope has been omitted from the sectional view of FIG. 2. Energetic electrons in the electron beam 40 travel in the direction of the arrow heads superimposed on the electron beam as shown in FIG. 2.

The energetic electrons in the electron beam 40 are directed by the electron gun 16 along a longitudinal axis 38 (shown in the figures in dotted line form) of the electron beam device 10. Electron beam 40 initially transits an electron beam limiter 18 comprised of first, second and third apertured plates 20, 24, and 28. An exploded perspective view of the electron beam limiter 18 is shown in FIG. 1a. Each of the first, second and third plates 20, 24 and 28 is in the general form of a flat, round disk with each of the disks aligned along the axis 38 of the electron beam device 10. First plate 20 includes a center circular aperture 20a. Second plate 24 also includes a center circular aperture 24a. Finally, third plate 28 includes a center circular aperture 28a. The electron beam is directed through the three aligned apertures 20a, 24a and 28a in the first, second and third plates 20, 24 and 28. As shown in FIG. 1a, the three apertures 20a, 24a and 28a are of different sizes, with aperture 20a being the largest and aperture 28a being the smallest. Thus, the three beam passing apertures 20a, 20b and 20c are of decreasing size in proceeding in the direction of travel of the electron beam. Each of the three apertures 20a, 24a and 28a is sized so as to intercept a peripheral portion of the electron beam directed through the aligned apertures. Thus, aperture 20a intercepts a peripheral portion of the original electron beam, resulting in a reduction in the cross-section of the beam. Similarly, aperture 24a intercepts the peripheral portion of the reduced electron beam to further reduce the cross-section of the beam, with the beam then directed through aperture 28a in the third plate 28. Aperture 28a further reduces the cross-section of the beam to provide the beam with a very small cross-sectional area to produce a well defined electron beam spot size of very small dimensions on a target 36 which is aligned with the electron beam device 10 so as to intercept the electron beam. In the present example, target 36 is a substrate on which is formed an integrated circuit pattern by the electron beam 40 as it is displaced over the substrate in a manner described below.

Disposed between adjacent apertured plates and aligned along the electron beam device's longitudinal axis 38 are respective beam centering electrodes. Thus, a first beam centering electrode 22 is disposed intermediate the first and second apertured plates 20, 24. Similarly, a second beam electrode 26 is disposed intermediate the second and third apertured plates 24, 28. Each of the first and second beam positioning electrodes 22, 26 is coaxially disposed about the electron beam device's longitudinal axis 38 and is comprised of plural electrode elements disposed in a spaced manner about the axis. Thus, the first beam positioning electrode 22 includes first, second, third and fourth electrode elements 22a, 22b, 22c and 22d. The four electrode elements are symmetrically disposed about the electron beam device's longitudinal axis 38 in a spaced manner with the electron beam transiting the space between the four electrode elements. The second beam positioning electrode 26 similarly includes first, second, third and fourth electrode elements 26a, 26b, 26c and 26d which are symmetrical disposed about axis 38 in a spaced manner. Each of the electrode elements in each of the first and second beam positioning electrodes 22, 26 is connected to a set of voltage sources for electrostatically charging the electrode elements. This can be seen for the case of electrode elements 22a and 26a which are shown in FIG. 2 connected to voltage sources $V_4$ and $V_5$, respectively. The second and fourth electrode elements of each of the first and second beam centering electrodes 22 and 26 are similarly connected to respective voltage sources for electrostatically charging the electrode elements. Pairs of electrode elements in each of the first and second beam centering electrodes 22, 26 diametrically disposed on opposed sides of the axis 38 electrostatically center the electron beam 40 within the three aligned apertures 20a, 24a and 28a respectively in the first, second and third plates 20, 24 and 28. The relative polarity and voltage difference between diametrically opposed electrode elements is used to precisely position the electron beam. This ensures that the most intense, or densest, portion of the electron beam 40 is used for forming the reduced cross-section electron beam incident on the target 36.

Referring to FIG. 1b, there is shown another embodiment of an electronic beam limiting arrangement for use in the present invention. FIG. 1b is a sectional view, where even the electron beam 62 is shown in section. Electron beam 62 first transits a beam centering device 64 having an aperture 64a through which the beam is directed. Beam centering device 64 electrostatically centers the electron beam 62 as described above in terms of the previously described embodiment. After transiting the beam centering device 64, the electron beam 62 is then directed through a tapered aperture 66a in a beam limiting plate 66 as the beam travels in the direction of arrow 65. Tapered aperture 66a reduces the cross-section of the electron beam 62 as the beam transits the beam limiting plate 66 as shown in the figure. The beam limiting plate 66 is preferably comprised of a heat resistant metal such as platinum having a thickness sufficient to dissipate the heat generated by electron beam 62 incident upon the plate.

Electron beam 40 is focused on the target 36 by means of the combination of a first focusing electrode 30 and electrostatic electron lenses 32 and 34. As shown in the figures, the first focusing electrode 30 is preferably in the form of a hollow cylinder aligned along the electron beam device's longitudinal axis 38. Electrostatic electron lens 34 may also be in the form of a hollow cylinder aligned coaxially with the electron beam device's longitudinal axis 38 as shown in FIG. 2. Electrostatic electron lens 34 may also be in the form of first, second, third and fourth lens elements 34a, 34b, 34c and 34d as shown in FIG. 1. Each of the lens elements is in the form of a rectangular, flat plate, with the plates arranged concentrically about the electron beam device's longitudinal axis 38 in a spaced manner. The plane of each of the first, second, third and fourth flat lens elements 34a, 34b, 34c and 34d is aligned parallel with the electron beam device's longitudinal axis 38 or they may be tapered. A first focus voltage $V_{F1}$ is provided to the first cylindrical focusing electrode 30, while a second focus voltage $V_{F2}$ is provided to the electrostatic electron lens 34. Where the electrostatic electron lens 34 is comprised of the four lens elements 34a, 34b, 34c and 34d shown in FIG. 1, the second focus voltage $V_{F2}$ is provided to each of the four lens elements. First and second electrostatic lenses are formed between the first focusing electrode 30 and an electron beam deflector 32 and between the electron beam deflector 32 and the electrostatic electron lens 34. In combination, the first focusing lens formed by electrodes 30 and 32 and the second focusing lens formed by electrodes 32 and 34 focus the electron beam 40 to a small spot on target 36.

Disposed intermediate the first cylindrical focusing electrode 30 and the electrostatic electron lens 34 and also aligned along the electron beam device's longitudinal axis 38 is the aforementioned electron beam deflector 32. In the described embodiment, electron beam deflector 32 is comprised of first, second, third and fourth generally flat deflector plates 32a, 32b, 32c and 32d. By applying an appropriate polarity and dynamic voltage value to each of the four deflector plates, the electron beam 40 is displaced over the target 36 in tracing out an electronic integrated circuit pattern on the target. The first and third lens elements 32a, 32c displace the electron beam 40 in a first direction while the second and fourth lens elements 32b, 32d displace the electron beam in a second direction. The first and second directions are transverse to one another, allowing the electron beam 40 to trace out a two-dimensional raster figure representing an electronic integrated circuit pattern on the target 36. A first dynamic sweep voltage $V_{S1}(t)+V_F$ is applied to the first lens element 32a, while a second dynamic sweep voltage $V_{S2}(t)+V_F$ is applied to the third lens element 32c as shown in FIG. 2. This permits the first and second lens elements 32a, 32c to displace the electron beam 40 in a direction generally in the plane of the figure. A similar sweep voltage arrangement is applied to the second and fourth lens elements 32b, 32d to displace the electron beam 40 in a direction generally perpendicular to the plane of the figure. A combination of the four electrostatically charged deflector plates deflects the electron beam 40 in two dimensions as the beam traces an electronic circuit pattern on target 36.

Various voltages are provided to the components of the electron beam device 10 as shown in FIG. 2. Thus, $V_{anode}$ is an anode voltage provided to the device's electron gun 16 as well as to the first, second and third apertured plates 20, 24 and 28. Fixed focus voltages $V_1$ and $V_2$ are respectively provided to the first cylindrical focusing electrode 30 and the electrostatic electron lens 34. Time variable deflection voltages $V_{S1}(t)+V_F$ and $V_{S2}(t)+V_F$ change with time and respectively provided to the first and third deflector plates 32a and 32c. Similar variable voltages are provided to the second and fourth deflective plates 32b and 32d although this is not shown in the figures for simplicity. A focus $V_F$ is added to the aforementioned time variable deflection voltages to provide a composite voltage to each of the four deflector plates. The $V_3$ is provided to the target 36.

FIG. 2 also includes additional elements not shown in FIG. 1 which form another embodiment of the present invention. Shown in FIG. 2 are auxiliary deflector plates 32a' and 32c'. Another pair of opposed auxiliary deflector plates disposed to the adjacent deflector plates 32a' and 32c' are included in this embodiment of the invention, but are not shown in the figure for simplicity. The second set of auxiliary deflector plates are disposed between the first set of deflector plates 32a–32d and the electrostatic electron lens 34. As shown in FIG. 2, the second set of auxiliary deflector plates are much shorter than the first set of deflector plates and thus provide a much shorter deflection region for electron beam 40. A voltage $V_{S3}(t)+V_F$ is provided to deflector plate 32a', while voltage $V_{S4}(t)+V_F$ is provided to deflector plate 32c'. Similar voltages are provided to the other two auxiliary deflector plates disposed adjacent deflector plates 32a' and 32c'. Thus, different deflection voltages are provided to the first and second sets of deflector plates as shown in FIG. 2. The first set of deflector plates including deflector plates 32a–32d are used for deflecting the electron beam 40 over the entire raster area of coverage as defined by target 36. The second deflection region defined by the supplemental deflector plates including plates 32a' and 32c' are used for more precise positioning of the electron beam 40 on target 36. Thus, the auxiliary deflector plates including plates 32a' and 32c' provide a region of reduced deflection sensitivity for more precise positioning of the electron beam 40 on target 36. In the preferred embodiment, the dynamic voltages provided to both the primary and supplemental deflector plates are digitized voltage for more accurate positioning of the electron beam 40 on target 36.

Referring to FIG. 3, there is shown a graphic representation of electron beam density as a function of the size of a circular electron beam passing aperture for three different size apertures aligned along a common axis in accordance with one aspect of the present invention. As previously described, the first aperture plate 20 has a beam passing aperture of diameter $d_1$, while the second aperture plate 24 has a beam passing aperture of diameter $d_2$. The third aperture plate 28 has a beam passing aperture of diameter $d_3$, where $d_1 > d_2 > d_3$. As shown in FIG. 3, a cross-sectional diameter of the electron beam is reduced to the diameter $d_1$ of the aperture in the first plate 20 as the beam transits this plate. The cross-sectional diameter of the electron beam is further reduced to $d_2$ as the beam transits the second plate 24. The cross-sectional diameter of the beam is further reduced to $d_3$ when the electron beam transits the aperture in the third plate 28. It is in this manner that the cross-section of the beam is reduced to a small spot on the illuminated target 36 by using plural, spaced plates each having a smaller beam passing aperture. The cross-section of the electron beam may be reduced to a very small size without damaging the beam limiting plates such as by melting the portion of plate upon which the high energy electron beam is incident. The multi-stage beam intercepting arrangement of the present invention avoids damage by the high energy electron beam by isolating and dividing the high energy absorption among plural beam limiting plates. The tapered beam limiting aperture described above is made possible by use of the proper heat-resistant materials and by providing the beam limiting plate with sufficient thickness to be able to dissipate the absorbed energy in the form of heat.

FIG. 4 is a graphic representation of electron beam density profile as a function of the size of the electron beam passing aperture for the case of the largest beam. passing aperture in the first apertured plate 20. A comparison of FIGS. 3 and 4 shows that the second and third apertured plates 24, 28 further reduce the electron beam's profile, or cross-section, after the beam transits the aperture in the first plate 20.

Figure 5:
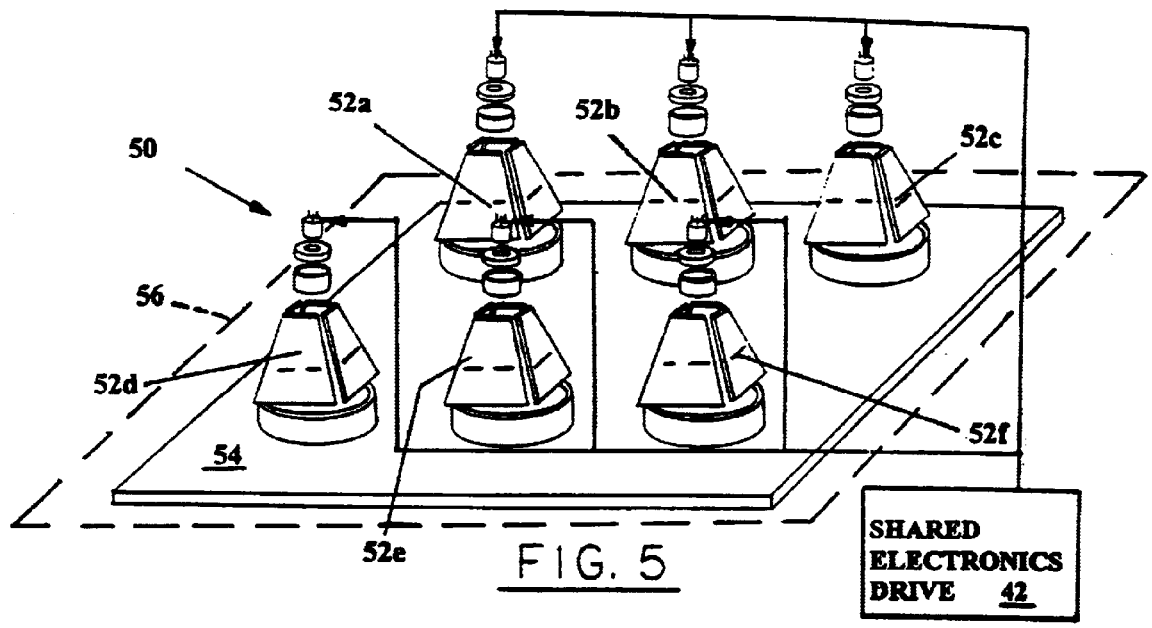
FIG. 5 is a simplified perspective view showing a two-dimensional matrix array of electron beam devices in accordance with another aspect of the present invention for simultaneously manufacturing plural semiconductor devices.

Referring to FIG. 5, there is shown a multipie electron beam device array 50 in accordance with another aspect of the present invention. As shown in the figure, plural electron beam devices 52a–52f are positioned above a substrate 54 and are arranged in an M×N matrix array for directing plural electron beams onto the substrate for simultaneously forming plural electronic circuit patterns on the substrate. In this manner, a large number of electronic circuit patterns may be simultaneously formed on the substrate 54 which may then be divided into smaller sections, each forming a separate individual semiconductor integrated circuit wafer. Alternatively, each electron beam may be incident on a separate semiconductor integrated circuit wafer for forming an integrated circuit pattern simultaneously on plural substrates. Also as shown in the figure in simplified schematic diagram form, each of the plural electron beam devices 52a–52f is attached to and supported by a support/ displacement mechanism 56 (shown in the figure in dotted line form). The support/displacement mechanism 56 is connected to each of the electron beam devices 52a–52f for supporting and displacing the electron beam devices in simultaneously forming plural electronic circuit patterns on the substrate 54. The support/displacement mechanism 56 is shown simply as a planar element engaging and supporting each of the electron beam devices 52a–52f, but may take other forms such as separate mechanisms for supporting and displacing each of the electron beam devices. The support/ displacement mechanism 56 may include convention displacement means as such as a stepping motor. In the alternative, each of the electron beam devices 52a–52f may be attached to a fixed support/displacement mechanism 56 and the substrate 54 may be displaced so that each of the respective electron beams trace out a separate electronic integrated circuit pattern on the substrate. Also as shown in the figure, each individual electron beam device may be connected to a common shared electronics drive circuit 42 which provides electric power and control inputs to each device. The shared electronic drive 42 provides such inputs as high voltage, focus voltages, dynamic deflection voltages, video drive signals, etc., to reduce the cost of the matrix array of electron beam devices.

Figure 6:
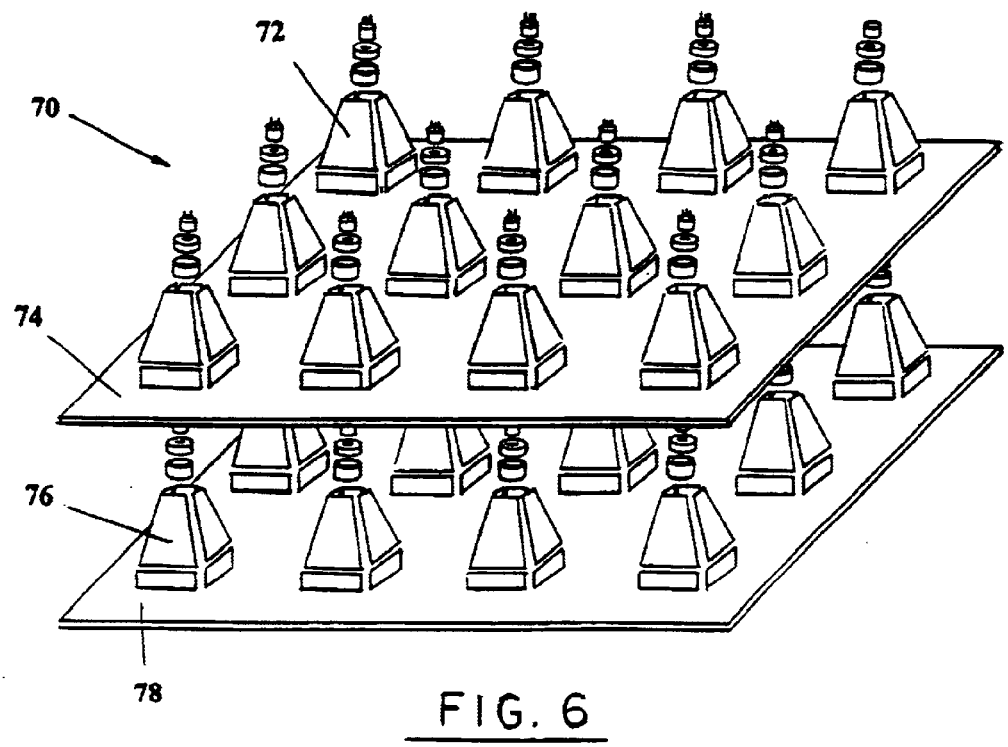
FIG. 6 is a simplified perspective view of a three-dimensional matrix array of electron beam devices in accordance with yet another aspect of the present invention for use in the simultaneous fabrication of plural semiconductor devices.

Referring to FIG. 6, there is shown another embodiment of a stacked electron beam device array 70 in accordance with another aspect of the present invention. In the stacked electron beam device array 70 of FIG. 6, an upper array of electron beam devices 72 (where only one of the electron beam devices is numbered for simplicity) is positioned above a first substrate 74 for directing plural electron beams onto the substrate for simultaneously forming plural electron beam circuit patterns on the substrate. Similarly, plural lower electron beam devices 76 direct electron beams onto a second lower substrate 78 for simultaneously forming plural electron circuit patterns on the substrate. The electron beam device matrix array of FIG. 5 and the stacked matrix array of electron beam devices of FIG. 6 allows for the simultaneous manufacture of large numbers of electronic integrated circuit patterns simultaneously to increase the throughput and reduce the cost of electronic circuit manufacture. These three dimensional matrix arrays also reduce the clean room space requirements for the integrated circuit pattern forming elements which also reduces manufacturing costs involved in building and maintaining an expensive "super clean room." The matrix array and stacked matrix array of multiple electron beam devices shown in FIGS. 5 and 6 is made possible by the small size of the electron beam device of the present invention which incorporates the inventive deflection lens arrangement.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. An electron beam device for directing a beam of energetic electrons onto a substrate for forming an integrated circuit pattern on the substrate, said electron beam device comprising:

a source of energetic electrons for directing a beam of electrons along an axis;

multi-stage beam limiting means disposed in a spaced manner along said axis adjacent said source of energetic electrons for intercepting a peripheral portion of the electron beam and reducing the cross section of the electron beam, wherein each stage of said beam limiting means incrementally reduces the cross section of the electron beam in proceeding toward the substrate;

focusing means disposed along said axis intermediate said beam limiting means and the substrate for forming a beam electrostatic focus region in the electron beam device for focusing the electron beam to a spot on the substrate; and multi-stage electrostatic deflection means disposed in a spaced manner along said axis intermediate said beam limiting means and the substrate and generally co-located with said focusing means for forming a beam electrostatic deflection region for deflecting the electron beam over the substrate in forming a circuit pattern on the substrate, wherein said beam electrostatic focus region and said beam electrostatic deflection region overlap and are coincident along said axis, and wherein each stage of said electrostatic deflection means has a different incremental deflection sensitivity for exerting increasing incremental deflection sensitivity on the electron beam in proceeding toward the substrate.

2. The electron beam device of claim 1 wherein said source of energetic electrons comprises an electron gun.

3. The electron beam device of claim 1 wherein said multi-stage beam limiting means includes plural, apertured plates disposed in a spaced manner along said axis, and wherein the apertures in said plates are aligned along said axis and said beam of electrons is directed through the aligned apertures.

4. The electron beam device of claim 3 wherein each of said apertures is circular and said apertures decrease in size in proceeding along said axis in the direction of travel of the beam.

5. The electron beam device of claim 4 wherein each of said plates has a respective thickness, with the thickness of said plates decreasing along said axis in the direction of travel of the beam.

6. The electron beam device of claim 5 wherein said multi-stage beam limiting means comprises first, second and third generally flat apertured plates having thicknesses $t_1$, $t_2$, and $t_3$, respectively, and apertures having diameters $d_1$, $d_2$, and $d_3$, respectively, and wherein said first plate is in facing relation to said source of energetic electrons and said second plate is disposed intermediate said first and third plates, and wherein $t_1 > t_2 > t_3$ and $d_1 > d_2 > d_3$.

7. The electron beam device of claim 3 further comprising electrostatic beam positioning means disposed adjacent said plates for centering the electron beam in the apertures of said plates.

8. The electron beam device of claim 7 wherein said electrostatic beam positioning means included plural electrostatically charged electrodes each aligned along said axis and disposed intermediate adjacent apertured plates.

9. The electron beam device of claim 8 wherein each of said electrostatically charged electrodes includes plural charged members disposed in a spaced manner concentrically about said axis, and wherein each of said charged members is equidistant from said axis.

10. The electron beam device of claim 9 wherein each of said plural members of an electrostatically charged electrode is connected to a respective voltage source.

11. The electron beam device of claim 10 wherein each voltage source is adjustable for providing selected voltages to the plural members of an electrostatically charged electrode.

12. The electron beam device of claim 10 wherein each electrode includes four members, and wherein a first pair of charged members diametrically disposed with respect to said axis center the electron beam in a first direction and a second pair of charged members diametrically disposed with respect to said axis center the electron beam in a second direction, and wherein said first and second directions are transverse.

13. The electron beam device of claim 1 wherein said beam limiting means includes an apertured plate disposed in a spaced manner along said axis, said plate including a tapered aperture through which said beam of electrons is directed, said tapered aperture defined by a larger opening on a first side of said plate in facing relation to said source of energetic electrons and a smaller opening on a second, opposed side of said plate in facing relation to said focusing means.

14. The electron beam device of claim 13 wherein said plate is comprised of platinum.

15. The electron beam device of claim 1 wherein said multi-stage electrostatic deflection means includes plural sets of deflection plates disposed in a spaced manner about said axis, and wherein said sets of deflection plates are disposed in a spaced manner along said axis.

16. The electron beam device of claim 15 wherein each of said deflection plates is generally flat and is disposed lengthwise along said axis.

17. The electron beam device of claim 16 wherein each deflection plate has first and second opposed ends respectively disposed in facing relation to said beam limiting means and to said substrate, and wherein the first end of each of said plates is disposed closer to said axis than the second opposed end of the plate.

18. The electron beam device of claim 17 wherein each of said deflection plates is generally trapezoidal in shape and said first end is parallel to and shorter than said second opposed end.

19. The electron beam device of claim 15 wherein each set of deflection plates includes four deflection plates, and wherein a first pair of deflection plates diametrically disposed with respect to said axis deflect the electron beam in a first direction and a second pair of deflection plates diametrically disposed with respect to said axis deflect the electron beam in a second direction, and wherein said first and second directions are transverse.

20. The electron beam device of claim 15 wherein each of said deflection plates is connected to a respective dynamic voltage source.

21. The electron beam device of claim 15 including a first set of deflection plates disposed in facing relation to said beam limiting means for coarse deflection of the electron beam and a second set of deflection plates disposed between said first set of deflection plates and said substrate for fine deflection of the electron beam.

22. The electron beam device of claim 21 wherein said first set of deflection plates are connected to a first dynamic voltage source and said second set of deflection plates are connected to a second dynamic voltage source.

23. The electron beam device of claim 1 wherein said focusing means includes first and second focusing electrodes disposed along said axis on respective sides of said electrostatic deflection means, and wherein said first focusing electrode is in facing relation to said beam limiting means and said second focusing electrode is in facing relation to the substrate.

24. The electron beam device of claim 23 wherein said first and second focusing electrodes are generally cylindrical in shape and are concentrically disposed about said axis.

25. The electron beam device of claim 23 wherein said second focusing electrode includes plural charged lens elements disposed in a spaced manner about said axis.

26. The electron beam device of claim 25 wherein each of said lens elements is a generally flat plate connected to a respective voltage source, and wherein each of said flat plates is aligned generally parallel to said axis.

27. The electron beam device of claim 26 wherein said second focusing electrode includes four generally flat charged lens elements, and wherein a first pair of lens elements are diametrically disposed relative to one another with respect to said axis and a second pair of lens elements are diametrically disposed relative to one another with respect to said axis.

28. The electron beam device of claim 27 wherein said first focusing electrode is generally cylindrical in shape and is concentrically disposed about said axis.

29. The electron beam device of claim 1 further comprising an envelope substantially disposed about said source of energetic electrons, said beam limiting means, said focusing means, and said electrostatic deflection means.

30. The electron beam device of claim 29 wherein said envelope is comprised of glass.

31. The electron beam device of claim 29 wherein said envelope is conductive.

32. An arrangement for simultaneously forming plural electronic circuit patterns of an integrated circuit, said arrangement comprising:

first plural electron beam devices arranged in a generally planar, matrix array, wherein each electron beam device has a respective longitudinal axis along which a respective electron beam emitted by the electron beam device is directed, and wherein the longitudinal axes of said electron beam devices are in parallel alignment;

one or more first substrate members disposed in spaced relation from said electron beam devices along the longitudinal axes of said electron beam devices, wherein each electron beam is directed onto a single substrate member or wherein each electron beam is directed onto a respective substrate member; and means for supporting and displacing said electron beam devices, wherein each of said electron beams forms an electronic circuit pattern on said single substrate member or on a respective one of said plural substrate members.

33. The arrangement of claim 32 further comprising second plural electron beam devices arranged in generally planar, matrix array for directing their respective electron beams onto one or more second substrates, and means for supporting and displacing said second plural electron beam devices for forming second electronic circuit patterns on said one or more second substrates, wherein said first and second plural electron beam arrays are arranged in a stacked manner.

34. The arrangement of claim 32 wherein each of said electron beam devices is connected to a common control circuit for energizing and controlling said electron beam devices.

* * * * *